(12) United States Patent
Pokharna

(10) Patent No.: US 6,801,430 B1
(45) Date of Patent: Oct. 5, 2004

(54) ACTUATION MEMBRANE TO REDUCE AN AMBIENT TEMPERATURE OF HEAT GENERATING DEVICE

(75) Inventor: Himanshu Pokharna, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/435,146

(22) Filed: May 9, 2003

(51) Int. Cl.[7] ................................................ H05K 7/20

(52) U.S. Cl. .................. 361/695; 361/694; 361/719; 361/720; 165/80.2; 165/84; 174/16.1

(58) Field of Search .............................. 361/689, 690, 361/694–695, 699, 719; 257/706, 714; 174/15.1, 16.1, 16.3; 165/80.3, 80.4, 104.33; 62/259.2

(56) References Cited

U.S. PATENT DOCUMENTS

| | | | | | |
|---|---|---|---|---|---|
| 5,566,377 | A | * | 10/1996 | Lee | 361/695 |
| 5,914,856 | A | * | 6/1999 | Morton et al. | 361/690 |
| 5,966,286 | A | * | 10/1999 | O'Connor et al. | 361/699 |
| 6,123,145 | A | * | 9/2000 | Glezer et al. | 165/104.33 |
| 6,252,769 | B1 | * | 6/2001 | Tullstedt et al. | 361/694 |
| 6,347,034 | B1 | * | 2/2002 | Holmberg | 361/600 |
| 6,501,654 | B2 | * | 12/2002 | O'Connor et al. | 361/699 |
| 6,588,497 | B1 | * | 7/2003 | Glezer et al. | 165/84 |
| 6,611,425 | B2 | * | 8/2003 | Ohashi et al. | 361/687 |
| 6,629,425 | B2 | * | 10/2003 | Vaiyapuri | 62/259.2 |
| 6,631,077 | B2 | * | 10/2003 | Zuo | 361/699 |
| 6,650,542 | B1 | * | 11/2003 | Chrysler et al. | 361/699 |

* cited by examiner

Primary Examiner—Boris Chervinsky
(74) Attorney, Agent, or Firm—Blakely, Sokoloff, Taylor & Zafman LLP

(57) ABSTRACT

An apparatus including an actuation membrane unit to generate air movement in a direction of a heat generating device to reduce an ambient temperature of the device.

11 Claims, 3 Drawing Sheets

ACTUATION MEMBRANE TO REDUCE AN AMBIENT TEMPERATURE OF HEAT GENERATING DEVICE

TECHNICAL FIELD

Embodiments described herein relate to heat management and more particularly to heat management using an actuation membrane.

BACKGROUND

Heat management can be critical in many applications. Excessive heat can cause damage to or degrade the performance of mechanical, chemical, electric, and other types of devices. Heat management becomes more critical as technology advances and newer devices continue to become smaller and more complex, and as a result run hotter.

Modern electronic circuits, because of their high density and small size, often generate a substantial amount of heat. Complex integrated circuits (ICs), especially microprocessors, generate so much heat that they are often unable to operate without some sort of cooling system. Further, even if an IC is able to operate, excess heat can degrade an IC's performance and can adversely affect its reliability over time. Inadequate cooling can cause problems in central processing units (CPUs) used in personal computers (PCs), which can result in system crashes, lockups, surprise reboots, and other errors. The risk of such problems can become especially acute in the tight confines found inside laptop computers and other portable computing and electronic devices.

Prior methods for dealing with such cooling problems have included using heat sinks, fans, and combinations of heat sinks and fans attached to ICs and other circuitry in order to cool them. However, in many applications, including portable and handheld computers, computers with powerful processors, and other devices that are small or have limited space, these methods may provide inadequate cooling.

In particular, cooling devices mounted on the bottom of a motherboard present a more acute problem. Typically, there is less room between the bottom face of the mother board and the bottom skin of a portable computer (i.e., notebook computer). As a result, it becomes difficult to fit a device on the underside of the motherboard to reduce the temperature of heat generating devices mounted to the underside of the motherboard. Furthermore, mounting heat generating devices to the underside of the motherboard also creates the undesirable effect of sometimes generating a hot spot on the bottom skin of the notebook computer, further creating the need to reduce the temperature of the heat generating devices mounted on the bottom side of a motherboard. Hot spots on the bottom skin of a notebook computer are becoming even more commonplace today as the skin of notebooks are becoming ever thinner.

One possible solution to reduce the temperature of the heat generating devices mounted on the bottom side of a motherboard is illustrated in FIG. 1. As illustrated in FIG. 1, a fan 102 may be placed on a side of the motherboard 104 to generate a flow of air across a top side and bottom side of the motherboard to cool components 106 mounted on both sides of the motherboard. However, such a thermal solution takes away from the capability to cool heat generating devices mounted on the top side which create relatively larger amounts of heat (e.g., central processing units). Futhermore, the use of fans also creates undesirable noise.

DETAILED DESCRIPTION

Embodiments of an actuation membrane to generate air movement in a direction of a heat generating device to reduce a temperature of the device and/or to reduce an ambient temperature of the heat generating device, are disclosed. In the following description, numerous specific details are set forth. However, it is understood that embodiments may be practiced without these specific details. In other instances, well-known circuits, structures and techniques have not been shown in detail in order not to obscure the understanding of this description.

Reference throughout this specification to "one embodiment" or "an embodiment" indicate that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 2:
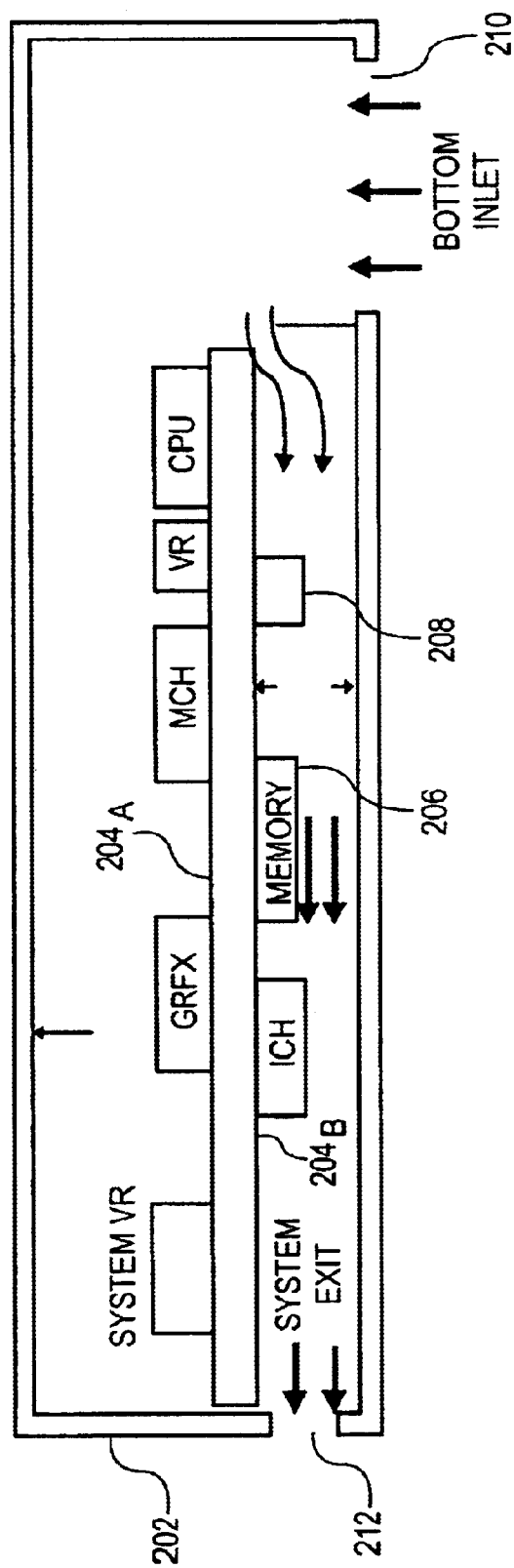
FIG. 2 is a cut-away illustration of a system incorporating an actuation membrane unit according to one embodiment.

In one embodiment, as illustrated in FIG. 2, a portable computer system 202 (such as a notebook computer, tablet personal computer, laptop computer, etc.) includes a motherboard 204, to which units are mounted. The motherboard includes a top side 204a and a bottom side 204a. In one embodiment, the space between the top side 204a of the mother board and the inside of the computer chassis (otherwise referred to as the "skin") is larger than the space between the bottom side 204b of the mother board and the inside of the computer chassis.

For example, as illustrated in the embodiment of FIG. 2, the space between the top side 204a of the mother board and the inside of the computer chassis is 8.2 mm, and the space between the bottom side 204b of the mother board and the inside of the computer chassis is only 5.5 mm. The distance between the top side 204a and the bottom side 204b of the motherboard and the computer chassis may vary in alternative embodiments.

Figure 1:
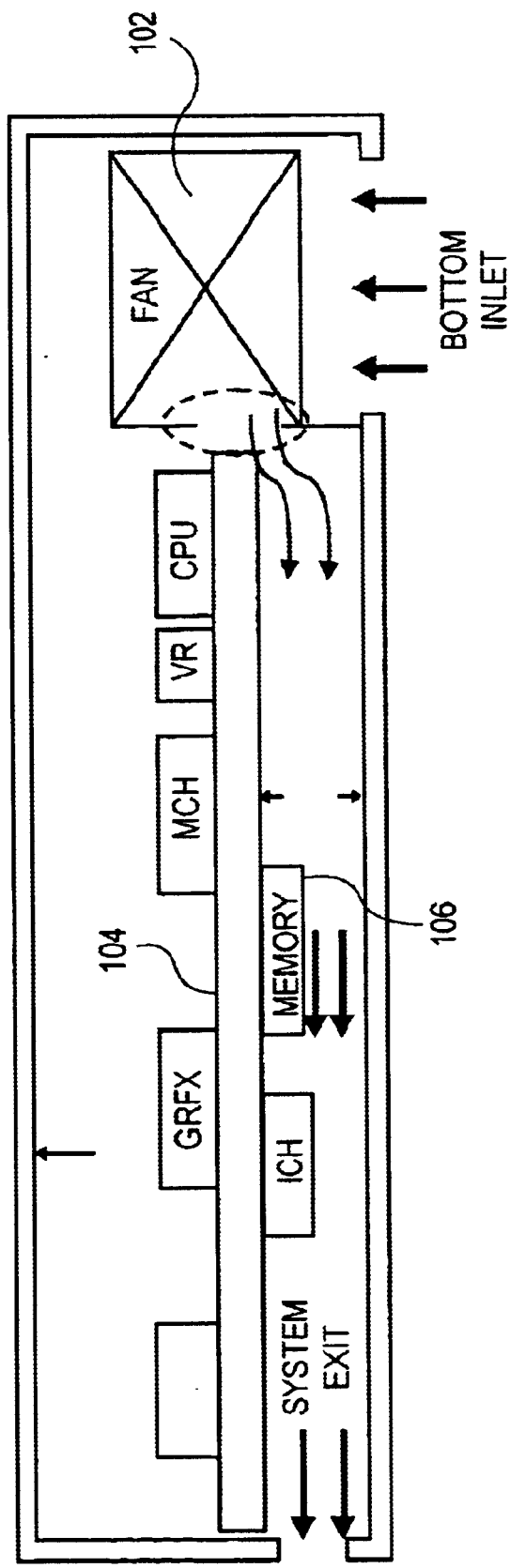
FIG. 1 is a perspective illustration of a prior art thermal solution.

Electronic components may be mounted on top side 204a and the bottom side 204b, as illustrated. In particular, as illustrated in FIG. 1, a memory unit 206 is mounted to the bottom side 204b of the motherboard. Alternatively, other heat generating devices may be mounted on the bottom side of the motherboard, such as a CPU, a chipset, a graphics controller (Grfx), or a wireless mini card.

In the embodiment illustrated in FIG. 2, an actuation membrane 208 is provided to generate streams of air in the direction of the memory unit, or other heat generating device(s). By generating streams of air in the direction of the heat generating device(s), the ambient temperature of the heat generating device, the temperature of the heat generating device, and/or the temperature of the inside and outside of the local area of the computer chassis may all be reduced. In alternative embodiments, an actuation membrane may be mounted on the top side 204a of the motherboard and positioned to generate a stream of air in the direction of heat generating devices mounted on the top side 204a of the motherboard.

Figure 3:
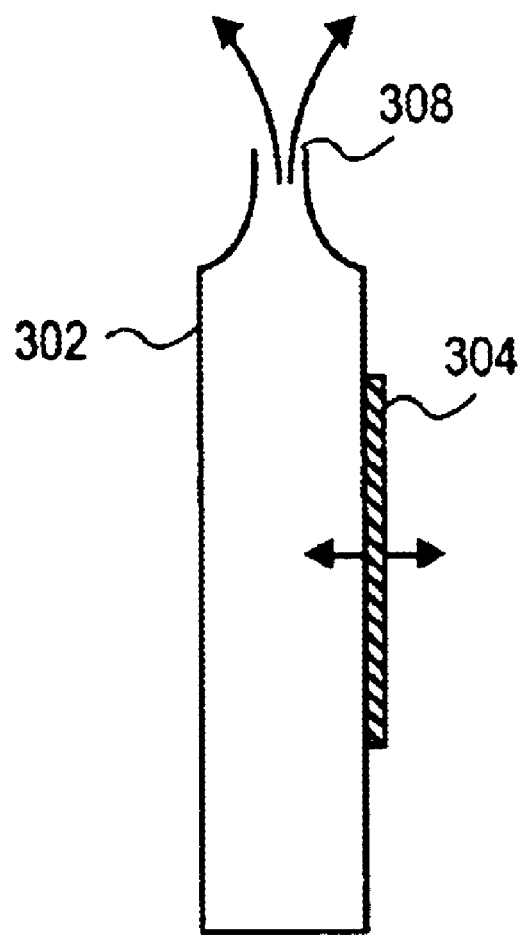
FIG. 3 is an illustration of an actuation membrane unit according to one embodiment.

In one embodiment illustrated in FIG. 3, the actuation membrane unit 302 includes a piezoelectric or electromagnetic membrane 304 that oscillates inward and outward, to pull air into the unit and force air out of the unit, respectively, to generate jet stream of air. More specifically, as shown in FIG. 3, when the membrane 304 oscillates outward away from the unit 302, air is pulled into the unit through the relatively small opening 308. When the membrane oscillates inward, the air is forced out of the opening 308 of the unit 302 to produce a jet stream of air.

In one embodiment, the actuation membrane unit 302 oscillation in the range of 20–200 Hz In alternative embodiments, higher and lower ranges of oscillation are provided. Furthermore, in one embodiment, the dimensions of the actuation membrane unit include a height of 5.5 mm or less, a length of 40 mm or less, and a width of 40 mm or less. In alternative embodiments, the dimensions of the actuation membrane unit may vary.

In one embodiment, as further illustrated in FIG. 2, the system includes an inlet 210 to accept external air into the system, and may further include a system exit 212 to release the warmer interior air that is forced out by the jet streams generated by the actuation membrane unit These embodiments have been described with reference to specific exemplary embodiments thereof. It will, however, be evident to persons having the benefit of this disclosure that various modifications and changes may be made to these embodiments without departing from the broader spirit and scope of the embodiments described herein. The specification and drawings are, accordingly, to be regarded in an illustrative rather than a restrictive sense.

What is claimed is:

1. An apparatus, comprising:
   an actuation membrane unit to generate air movement in a direction of a heat generating device to reduce an ambient temperature of the device, the heat generating device is at least one of a group comprising of a memory unit, a chipset, a graphics processor, and a processor, and the heat generating device and the actuation membrane unit are attached to a bottom side of a motherboard to be positioned within an interior chamber of a potable computer, and a space between the bottom side of the motherboard and an inner surface of a system chassis is 5.5 mm or less.

2. The apparatus of claim 1, wherein the actuation membrane unit includes a piezoelectric actuation membrane.

3. The apparatus of claim 1, wherein the actuation membrane unit includes an electromagnetic actuation membrane.

4. An apparatus, comprising:
   a synthetic jet unit to generate air movement in a direction of a heat generating device to reduce an ambient temperature of the device, the heat generating device is at least one of a group comprising of a memory unit, a chipset, a graphics processor, and a processor, and the heat generating device and the synthetic jet unit are attached to a bottom side of a motherboard to be positioned within an interior chamber of a potable computer, and a space between the bottom side of the motherboard and an inner surface of a system chassis is 5.5 mm or less.

5. The apparatus of claim 4, wherein the synthetic jet unit includes a piezoelectric actuation membrane.

6. A system comprising:
   a heat generating device, the heat generating device is at least one of a group comprising of a memory unit, a chipset, a graphics processor, and a processor; and
   an actuation membrane unit to generate air movement in a direction of the heat generating device to reduce a temperature of outer surface of the system, and the heat generating device and the actuation membrane unit are attached to a bottom side of a motherboard to be positioned within an interior chamber of the system, and a space between the bottom side of the motherboard and an inner surface of a system chassis is 5.5 mm or less.

7. The system of claim 6, wherein the actuation membrane unit includes a piezoelectric actuation membrane.

8. The system of claim 6, wherein the actuation membrane unit includes an electromagnetic actuation membrane.

9. A system comprising:
   a heat generating device, the heat generating device is at least one of a group comprising of a memory unit, a chipset, a graphics processor, and a processor;
   an actuation membrane unit to generate air movement in a direction of the heat generating device to reduce a temperature of outer surface of the system, and the heat generating device and the actuation membrane unit are attached to a bottom side of a motherboard to be positioned within an interior chamber of the system, and a space between the bottom side of the motherboard and an inner surface of a system chassis is 5.5 mm or less, and
   a graphic controller.

10. The system of claim 9, wherein the actuation membrane unit includes a piezoelectric actuation membrane.

11. The system of claim 9, wherein the actuation membrane unit includes an electromagnetic actuation membrane.

* * * * *

UNITED STATES PATENT AND TRADEMARK OFFICE
CERTIFICATE OF CORRECTION

PATENT NO. : 6,801,430 B1
DATED : October 5, 2004
INVENTOR(S) : Pokharna

It is certified that error appears in the above-identified patent and that said Letters Patent is hereby corrected as shown below:

<u>Column 3,</u>
Line 26, after "unit", insert -- 302 --.

<u>Column 4,</u>
Line 46, delete "graphic" and insert -- graphics --.

Signed and Sealed this

Nineteenth Day of April, 2005

JON W. DUDAS
*Director of the United States Patent and Trademark Office*